(12) United States Patent
Garcia

(10) Patent No.: US 6,716,038 B2
(45) Date of Patent: Apr. 6, 2004

(54) Z-AXIS CONNECTION OF MULTIPLE SUBSTRATES BY PARTIAL INSERTION OF BULGES OF A PIN

(75) Inventor: Steven E. Garcia, League City, TX (US)

(73) Assignee: Medallion Technology, LLC, Houston, TX (US)

( * ) Notice: Subject to any disclaimer, the term of this patent is extended or adjusted under 35 U.S.C. 154(b) by 33 days.

(21) Appl. No.: 10/209,009

(22) Filed: Jul. 31, 2002

(65) Prior Publication Data

US 2004/0023530 A1 Feb. 5, 2004

(51) Int. Cl.[7] ................................................. H01R 9/09
(52) U.S. Cl. ........................................................ 439/75
(58) Field of Search ........................... 439/75, 731, 751

(56) References Cited

U.S. PATENT DOCUMENTS

| | | | |
|---|---|---|---|
| 2,064,545 A | 12/1936 | Kleinmann et al. | |
| 2,752,580 A | 6/1956 | Shewmaker | |
| 3,017,605 A | 1/1962 | Platz et al. | |
| RE25,798 E | 6/1965 | Platz et al. | |
| 3,205,469 A | 9/1965 | Frank et al. | |
| 3,255,430 A | 6/1966 | Philips | |
| 3,258,736 A | 6/1966 | Crawford et al. | |
| 3,277,560 A | 10/1966 | Frank et al. | |
| 3,319,217 A | 5/1967 | Philips | |
| 3,333,225 A | 7/1967 | McNutt | |
| 3,400,358 A | 9/1968 | Byrnes et al. | |
| 3,402,466 A | 9/1968 | Philips | |
| 4,076,356 A | 2/1978 | Tamburro | |
| 4,358,180 A | 11/1982 | Lincoln | |
| 4,505,529 A | 3/1985 | Barkus | |
| 4,706,097 A | 11/1987 | Harmon | |
| 4,773,877 A | 9/1988 | Krüger et al. | |
| 4,843,315 A | 6/1989 | Bayer et al. | |
| 4,889,496 A | 12/1989 | Neidich | |
| 4,911,645 A | 3/1990 | August et al. | |
| 5,050,295 A | 9/1991 | Sullivan et al. | |
| 5,051,108 A | 9/1991 | Lincoln | |
| 5,106,310 A | 4/1992 | Krajewski et al. | |
| 5,129,830 A | 7/1992 | Krajewski et al. | |
| RE34,084 E | 9/1992 | Noschese | |
| 5,184,400 A * | 2/1993 | Cray et al. | 29/879 |
| 5,388,998 A | 2/1995 | Grange et al. | |
| 5,667,410 A | 9/1997 | Johnston | |
| 5,715,595 A * | 2/1998 | Kman et al. | 29/845 |
| 6,043,666 A | 3/2000 | Kazama | |

FOREIGN PATENT DOCUMENTS

| | | |
|---|---|---|
| JP | 55133549 | 10/1980 |
| JP | 55133550 | 10/1980 |
| JP | 568837 | 1/1981 |
| JP | 63208237 | 8/1988 |
| JP | 63293845 | 11/1988 |
| JP | 3209173 | 9/1991 |
| JP | 3209174 | 9/1991 |

OTHER PUBLICATIONS

Tecknit Interconnectoin Products, Standard Fuzz Button Contacts, 2 pages, Mar. 15, 2002.

* cited by examiner

*Primary Examiner*—Neil Abrams
*Assistant Examiner*—Phuong Dinh
(74) *Attorney, Agent, or Firm*—John R. Ley

(57) ABSTRACT

A three-dimensional circuit module includes z-axis connection pins, such as twist pins to electrically connect multiple, spaced-apart substrates, such as circuit boards. An expanding portion of a bulge of the pin mechanically and electrically contacts a corner edge of a via in a substrate without full insertion of the bulge in the via. Compression of the expanding portion of the non-inserted bulge establishes the electrical connection, which is also assisted by the longitudinal restraint on the pin relative to the substrate. Assembly and disassembly is facilitated without requiring the bulge to be fully inserted into the via.

38 Claims, 4 Drawing Sheets

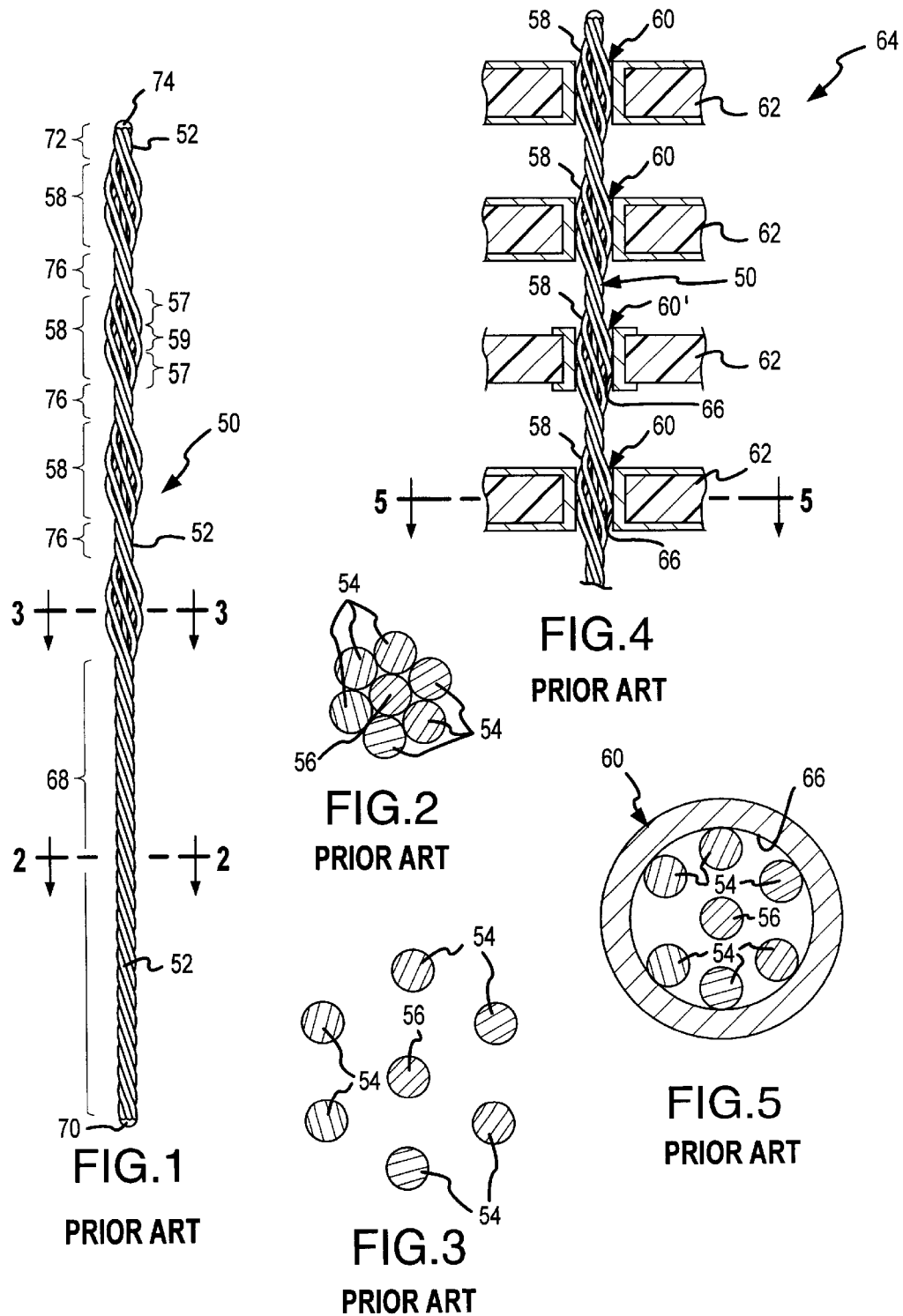

Z-AXIS CONNECTION OF MULTIPLE SUBSTRATES BY PARTIAL INSERTION OF BULGES OF A PIN

This invention relates to electrically connecting printed circuit boards and other similar substrates in a vertical or z-axis direction to form a three-dimensional circuit module by using z-axis interconnectors, preferably of the type known as twist pins. More particularly, the present invention relates to a new and improved electrical connection in which one or more bulges of the interconnector establish electrical contact with and between the substrates without fully inserting the bulge into a plated through hole or via in at least one of the substrates, thereby simplifying the assembly, connection and disconnection of the substrates in the three-dimensional circuit module.

BACKGROUND OF THE INVENTION

A variety of techniques have been developed for electrically connecting printed circuit boards, circuit components, substrates and/or other circuit elements into three-dimensional circuit modules. The propriety of using any one technique over another technique depends on the given situation and application for the module. Generally, the preferred technique in any situation is the one that enables the fastest, least-expensive and easiest assembly of the module in a manner which is consistent with the best use and longevity of the module. Additional considerations include the ease with which the module can be disassembled and reassembled, such as for troubleshooting or repair purposes.

To form a three-dimensional circuit module, usually a plurality of printed circuit boards, or substrates, are stacked vertically above one another. Vertical electrical connections between the stacked printed circuit boards are established by using z-axis interconnectors. Z-axis interconnectors extend vertically in the direction of the z-axis between the printed circuit boards which are oriented generally in a horizontal plane in the x-axis and y-axis directions. The z-axis interconnectors typically contact and extend through plated through holes or "vias" formed in each of the printed circuit boards. The electronic components and integrated circuits of each printed circuit board are connected to the vias by conductor traces formed on the surface of or within each printed circuit board. In this manner, the components of the printed circuit boards are connected to the components of one or more of the vertically stacked circuit boards, thereby creating a three-dimensional matrix of electrical connections, rather than limiting the electrical connections only to those elements on each circuit board. Consequently, a three-dimensional module of electrical connections and components is formed.

There are many benefits to three-dimensional circuit modules. One significant benefit is that a relatively large amount of electrical functionality can be obtained in a relatively small space or volume. This benefit maximizes the amount of electronic functionality for a given amount of space or reduces the amount of space required to obtain a given amount of electronic functionality.

To create the three-dimensional module, the vias are formed in each of the individual printed circuit boards at the same x-axis and y-axis locations, so that when the printed circuit boards are stacked in the three-dimensional module, the vias of the printed circuit boards are aligned vertically in the z-axis direction. The z-axis interconnectors are then inserted vertically through the aligned vias to establish the electrical contact and connection between the vertically separated circuit boards. Since the vias are connected to the electronic components on each circuit board by the traces, those components are also electrically interconnected in a three-dimensional manner.

A number of different types of z-axis interconnectors have been proposed. One particularly advantageous type of z-axis interconnector is known as a "twist pin." Twist pin z-axis interconnectors are described in U.S. Pat. Nos. 5,014,419, 5,064,192, and 5,112,232, all of which are assigned to the assignee hereof, as well as other prior art patents. General techniques for fabricating twist pins are described in these three patents, as well as in U.S. patent applications for a "High-Speed, High-Capacity Twist Pin Connector Fabricating Machine and Method," Ser. No. 09/782,987; a "Wire Feed Mechanism and Method Used for Fabricating Electrical Connectors," Ser. No. 09/782,991; a "Rotational Grip Twist Machine and Method for Fabricating Bulges of Twisted Wire Electrical Connectors," Ser. No. 09/782,888; and a "Pneumatic Inductor and Method of Electrical Connector Delivery and Organization," Ser. No. 09/780,981, all of which are assigned to the assignee hereof. The use of z-axis interconnectors to create three-dimensional modules from printed circuit boards is described in U.S. Pat. No. 5,045,975, also assigned to the assignee hereof.

An example of a prior art twist pin 50 is shown in FIGS. 1 and 2. The twist pin 50 is formed from a length of wire 52 which has been formed conventionally by helically coiling a number of outer strands 54 around a center core strand 56 in a planetary manner. At selected, spaced-apart segments along the length of the wire 52, an expanded bulge 58 is formed by untwisting the outer strands 54 in a reverse or anti-helical direction. As a result of untwisting the strands 54 in the anti-helical direction, the space consumed by the outer strands 54 increases, causing the outer strands 54 to bend, expand and diverge outward from the center strand 56 at the axis of the twist pin. The outer strands 54 expand outward from the regularly twisted wire 52 in a pair of generally frustroconically-shaped expanding portions 57 which meet at a maximum-diameter or maximum-width portion 59. At the maximum-width portion 59, the diameter for the bulge 58 is larger than the diameter of the regular stranded wire 52. The laterally outward extent of the maximum-width portion 59 of the bulge 58 is exemplified in FIG. 3, compared to FIG. 2.

The twist pin 50 has mechanical characteristics to maintain the shape of the wire in the expanded configuration, to allow the outer strands 54 to diverge outward in the expanding portions 57 to the maximum-width portion 59 at each bulge 58 when untwisted, and to cause the strands 54 at the maximum-width portion 59 to compress radially inward toward the center strand 56 when the bulge is inserted into a via of the printed circuit board. The radial compression of the outer strands 54 toward the center strand 56 at the bulge applies resilient radial contact force against a side wall of a via to establish the electrical connection of the twist pin to the via of the printed circuit board and to resist longitudinal movement of the twist pin relative to the printed circuit board.

The bulges 58 are positioned at selected predetermined distances along the length of the wire 52 to contact the vias 60 in printed circuit boards 62 of a three-dimensional module 64, as shown in FIG. 4. Contact of the bulges 58 with the vias 60 is established by pulling the twist pin 50 through an aligned vertical column of vias 60 in the module 64 while the printed circuit boards 62 are held in position. The resiliency of the outer strands 54 of the wire 52 at the bulges 58, when compressed radially inward by insertion into the somewhat smaller via 58, press against an inner surface of a sidewall 66 of each via 60, and thereby establish the electrical connection between the twist pin 50 and the via 60, as shown in FIG. 5.

To insert the twist pins 50 into the vertically aligned vias 60 of the module 64 with the bulges 58 contacting the inner surfaces 66 of the vias 60, a leader 68 of the regularly-coiled strands 54 and 56 extends at one end of the twist pin 50. The strands 54 and 56 at a terminal end 70 of the leader 68 have been welded or fused together to form a rounded end configuration 70 to facilitate insertion of the twist pin 50 through the column of vertically aligned vias. The leader 68 is of sufficient length to extend through all of the vertically aligned vias 60 of the assembled stacked printed circuit boards 62, before the first bulge 58 makes contact with the outermost via 60 of the outermost printed circuit board 62. The end of the leader 68 is gripped on the outside of the stacked printed circuit boards, and the twist pin 50 is pulled through the vertically aligned vias 60 until the bulges 58 are aligned and in contact with the vias 60 of the stacked printed circuit boards. To position the bulges in contact with the vertically aligned vias, the leading bulges 58 will be pulled into and out of most of the vertically aligned vias until the twist pin 50 arrives at its final desired position. The resiliency of the strands 54 allow the bulges 58 to move in and out of the vias without losing their ability to make sound electrical contact with the sidewall of the final desired via 60 into which the bulges 58 are positioned.

Once appropriately positioned, the leader 68 is cut off so that the end of the twist pin 50 is approximately at the same level or slightly beyond the outer surface of the outer printed circuit board of the module 64. The cut off leader 68 is then discarded. A tail 72 at the other end of the twist pin 50 extends a shorter distance beyond the last bulge 58. The strands 54 and 56 at a terminal end 74 of the tail 72 are also fused together. The length of the tail 72 positions the end 74 at a similar position to the location where the leader 68 was cut on the opposite side of the module. However, if desired, the length of the tail 72 or the remaining length of the leader 68 after it is cut may be made longer or shorter.

One of the difficulties of assembling the three-dimensional circuit module using twist pins in this manner is that it is necessary to retain the printed circuit boards at precise vertical intervals, so that the bulges of the twist pin contact and fit within the vias. Retaining the printed circuit boards at the vertical intervals can be tedious, particularly when the printed circuit boards are relatively small and when no mechanical spacers other than the twist pins hold the printed circuit boards together in the three-dimensional module. Moreover, pulling the leading bulges through many of the aligned vias before reaching the final desired position offers the possibility of damaging the plated through vias, or possibly damaging the circuit boards, by the force created in pulling the bulges through the vias.

It is sometimes necessary to disassemble the printed circuit boards from the three-dimensional module to repair or replace any defective components. Allowing the tail 72 and the remaining portion of the leader 68 to extend slightly beyond the outer printed circuit boards 62 of the module 64 facilitates gripping the twist pin 50 to pull it out of the module. Once the leader 68 is cut off after initial assembly, the twist pin 50 cannot be reused, because there is no leader available to pull it through the aligned vias. Upon reassembly, then, all of the above described steps must be repeated using a new twist pin.

SUMMARY OF THE INVENTION

The use of the z-axis interconnectors or twist pins as described herein enables fast, efficient, reliable assembly, as well as disassembly and reassembly, of a plurality of substrates, such as printed circuit boards, in a three-dimensional module. A first bulge of a twist pin is fully inserted into a via to hold the twist pin relative to the circuit board as result of the conventional compressive force of the bulge against the side wall of the via. However, a second longitudinally-spaced bulge of the twist pin is not fully inserted into a via. Instead, the expanding portion of the second bulge contacts an edge of the via without the maximum-width portion of the bulge moving completely into compressive contact with the side wall of the via. An electrical connection is established by radial compression of the expanding portion of the second bulge against the edge of the via. The adequacy of the connection is caused by the contact of the expanding portion of the bulge with a corner edge of the via, or by such contact and the effect of the fully inserted first bulge. The compression force of the fully inserted first bulge in the via resists movement of the twist pin in a direction which would relieve the contact force from the expanding portion of the second bulge with the corner edge of the via thereby maintaining the electrical contact in one aspect of the invention.

In another aspect of the invention, the contact of the expanding portion of the bulge creates sufficient force to establish electrical contact of a terminal end of the twist pin with a flat contact surface of an adjoining substrate or circuit board in the module. In a further aspect of the invention, the opposite expanding portions of a single bulge contact the corner edges of two vias in two spaced apart printed circuit boards or substrates, thereby establishing the electrical connection through the single bulge.

Because electrical contact is established without requiring the bulge to be fully inserted in the via, the assembly of the three-dimensional module is facilitated because the bulges do not have to be pulled through all of the aligned vias. Instead, the twist pin is connected to one circuit board, preferably by inserting the twist pin until the first fully-inserted bulge is located in the desired location, and then the adjoining second circuit board is retained relative to the first circuit board. The electrical contact to the second circuit board is established by contacting the expanding portion of the non-fully inserted second bulge with the corner edge. Not only is assembly facilitated in this manner, but for alignment purposes, the fully inserted and fully radially compressed first bulge will permit the entire twist pin to move longitudinally a sufficient amount to self-adjust or self-align itself with adequate contact force from the expanding portion of the non-inserted second bulge to establish a good electrical connection. Thus, the force created by the contact of the expanding portion of the bulge with the corner edge of the via may also be sufficient to reposition the first, fully inserted and radially compressed bulge within its via so that the second non-inserted bulge nevertheless makes sufficient contact to establish a good electrical connection, or to reposition the terminal end of the twist pin in good electrical connection with the flat contact connection surface of the adjoining substrate, or to establish good contact of the single bulge with the corner edge of two vias.

During assembly, the expanding portion of the bulge is biased against the corner edge while the substrates are held together. However, the twist pin is not retained by both substrates, but is only pressed against one of them. In this manner, upon disassembly or disconnection of the substrates, the twist pin loses contact with the one substrate without being pulled or pushed out of the other substrate. The substrates may then be reassembled without having to remove or replace the twist pin. Moreover, a new twist pin need not be used for reassembly.

Although described above in terms of a twist pin, the broader aspects of the invention apply to z-axis interconnectors or pins having bulges. The broader aspects of the invention also apply to connecting all types of substrates upon which electronic components are formed or connected or supported, including printed circuit boards and substrates made from composites, ceramics and other types of materials suitable for electronic circuit use. A more complete appreciation of the present disclosure and its scope, and the manner in which it achieves the above noted and other improvements, can be obtained by reference to the following detailed description of presently preferred embodiments taken in connection with the accompanying drawings, which are briefly summarized below, and the appended claims.

BRIEF DESCRIPTION OF THE DRAWINGS

FIG. 1 is a side elevational view of a prior art twist pin.

FIG. 2 is an enlarged, cross-sectional view of the twist pin shown in FIG. 1, taken substantially in the plane of line 2—2 shown in FIG. 1.

FIG. 3 is an enlarged, cross-sectional view of the twist pin shown in FIG. 1, taken substantially in the plane of line 3—3 shown in FIG. 1 through a maximum-width portion of a bulge of the twist pin.

FIG. 4 is a partial, vertical cross-sectional view of a prior art three-dimensional circuit module, formed by multiple printed circuit boards and illustrating a single twist pin of the type shown in FIG. 1 extending through vertically aligned vias of the printed circuit boards of the module.

FIG. 5 is an enlarged cross-sectional view of the twist pin within a via shown in FIG. 4, taken substantially in the plane of line 5—5 shown in FIG. 4.

DETAILED DESCRIPTION

Figure 6:
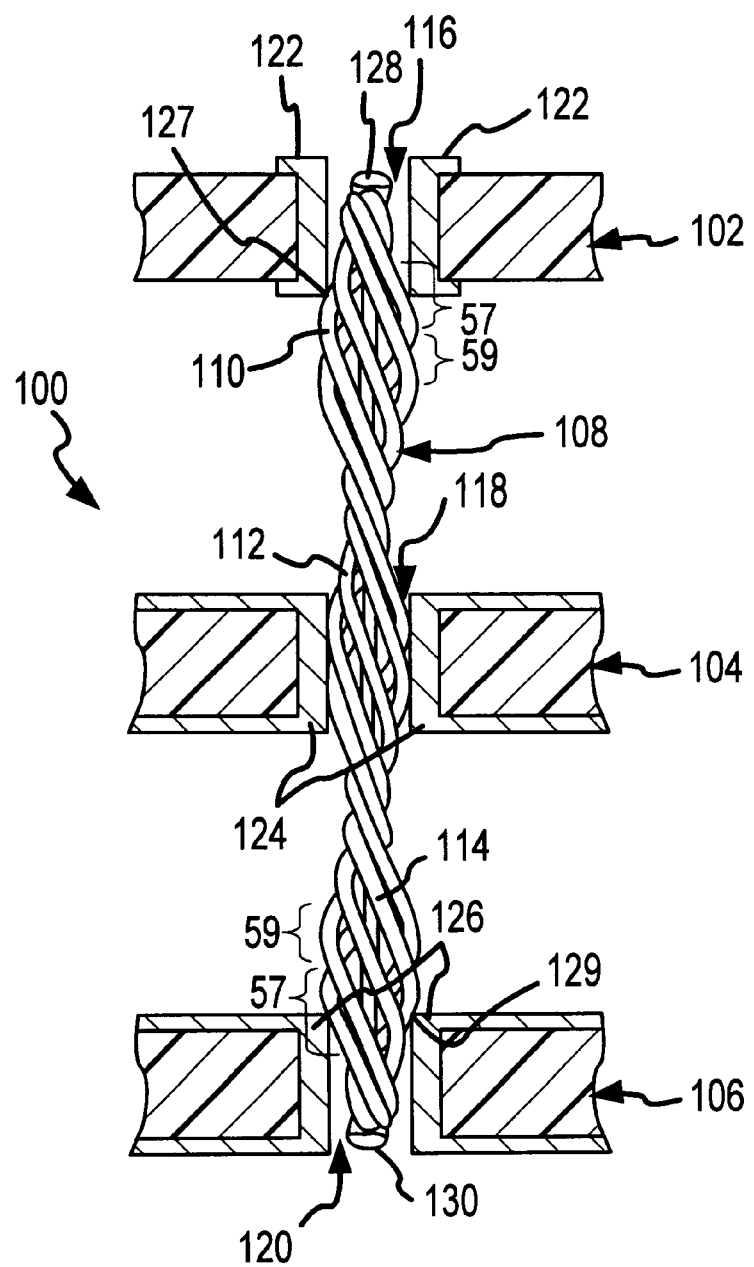
FIG. 6 is a partial, vertical cross-sectional view of a three-dimensional circuit module, formed by multiple printed circuit boards and illustrating a single twist pin electrically connecting the printed circuit boards of the module in accordance with the present invention.

A circuit assembly, or circuit board assembly, or circuit module 100 of the present invention is shown in FIG. 6. The circuit module 100 includes a plurality of circuit boards 102, 104 and 106 which are electrically connected by a twist pin 108. The circuit boards 102, 104 and 106 are, which are examples of substrates to which the present invention applies, and the twist pin 108 is one example of a z-axis interconnector or pin to which the present invention also applies. The twist pin 108 includes bulges 110, 112 and 114. The circuit boards 102, 104 and 106 include vertically aligned electrical connection points or vias 116, 118 and 120, respectively. The twist pin 108 electrically connects each of the circuit boards 102–106 at each of the vias 116–120. Thus, each bulge 110, 112 and 114 contacts a conductive portion such as the side wall of each via, and a metal trace conductor 122, 124 and 126 extends from each of the vias 116, 118 and 120, respectively, to electrically connect other circuit components (not shown) of the circuit boards 102–106.

One of the bulges 112 is fully inserted into one of the vias 118 of one of the circuit board 104. The remaining bulges 110 and 114 are not fully inserted into the vias 116 and 120. Thus, the maximum-width portion 59 of the fully inserted bulge 112 is radially compressed against the side wall of the via 118 by the resiliency of the strands which form the bulge 112, and the twist pin 108 is retained within the via 118 by the resulting compression and friction forces. The expanding portions 57 of the non-inserted bulges 110 and 114, on the other hand, contact a corner edge of the vias 116 and 120, respectively, without insertion of their maximum-width portions 59 within the vias 116 and 120.

With this configuration, the module 100 is quickly and easily assembled by inserting the twist pin 108 into the via 118 of the circuit board 104 until the bulge 112 is fully disposed within and compressed against the via 118 to retain the twist pin 108 relative to the circuit board 104. Then the circuit boards 102 and 106 are positioned and retained relative to the circuit board 104 such that the vias 116 and 120 are aligned with the via 118 and twist pin 108, and then the circuit boards are moved toward one another until the bulges 110 and 114 contact and are biased against the edges of the vias 116 and 120.

The twist pin 108 generally exhibits a relatively small or non-existant longitudinal deflection over its entire length in response to longitudinal compression forces. The bulges 110–114, on the other hand, deflect radially upon radial compression and readily return to an undeflected position upon release of the radial compression in a radial resilient or spring-like manner. The twist pin 108 can be gripped at a point preferably between two of the bulges 110–114 and pushed through the via 118 of the circuit board 104, so that one of the outer bulges 110 or 114 passes entirely through the via 118 and continues until the middle bulge 112 is within the via 118. In this manner, the twist pin may inserted through the via 118 without being longitudinally deflected or damaged and without the necessity for a long leader 68 (FIG. 1). The radial spring-like characteristics of the bulges 110–114 enable the outer bulge 110 or 114 to be compressed and deflected as it passes through the via 118, but to return to its undeflected position after passing through the via 118. Similarly, the resilient, spring-like characteristic of the bulge 112 enables it to be compressed to exert a radial force on the inner sidewall of the via 118. The radial compressive force between the bulge 112 and the via 118 enables a friction force between the sidewall of the via 118 and the bulge 112 to retain the twist pin 102 in position in the via 118 and relative to the circuit board 104. The radial compressive force also establishes a snug fit and good electrical connection between the bulge 112 and the via 118.

Since the twist pin 108 is retained by the compressive and frictional forces within the via 118, the subsequent assembly steps of connecting the outer circuit boards 102 and 106 are more simply accomplished than the prior art assembly techniques described above, in which the prior art twist pin 50 (FIGS. 1–5) must be pulled through all of the vias of the printed circuit boards 62 (FIGS. 1–5) while the printed circuit boards 62 are retained in position.

To assemble a three-dimensional circuit module using the present invention, outer circuit boards 102 and 106 are connected to or retained relative to the middle circuit board 104. The outer or distal (with respect to the middle bulge 112 and center circuit board 104) expanding portion of the bulges 110 and 114 near terminal ends 128 and 130 contacts corner edges 127 and 129 of the vias 116 and 120, respectively. Thus, the corner edges 127 and 129 of the vias 116 and 120 and the expanding portions 57 of the bulges 110 and 114 press against one another, respectively, causing a component of longitudinal compressive force in the twist pin 108 and a component of radial compression of the bulges 110 and 114 due to the diverging angular orientation of the expanding portions of the bulges. The bulges 110 and 114 are, thus, partially inserted into the vias 116 and 120 and slightly radially compressed to form a snug fit and a good electrical contact between the bulges 110 and 114 and the corner edges 127 and 129 of the vias 116 and 120, respectively. Though the expanding portions of the bulges 110 and 114 are slightly compressed against the corner edges of the vias 116 and 120, respectively, the maximum-width bulges 110 and 114 are not fully inserted into the vias 116 and 120. In this manner, the resilient or radial spring-like characteristics of the expanding portions of the bulges 110 and 114 maintain a radial compressive force on the corner edges of the vias 116 and 120 and a longitudinal compressive force between the bulges 110 and 114 of the twist pin 108 and the vias 116 and 120.

The compressive and frictional forces between the via 118 and the bulge 112 of the twist pin 102 prevent the twist pin 102 from moving relative to the via 118 before the outer circuit boards 102 and 106 can be connected or retained relative to the middle circuit board 104. After connecting or retaining the outer circuit boards 102 and 106, the frictional force between the sidewall of the via 118 and the bulge 112 continues to retain the twist pin 108 and the longitudinal self-aligning movement accommodates the assembly of the circuit module. In addition, the longitudinal compressive forces exerted by the expanding portions of the bulges 110 and 114 against the vias 116 and 120 cause the twist pin 108 to be firmly retained within the module 100.

The longitudinal compressive forces exerted by the expanding portions of the bulges 110 and 114 self-aligns or self-positions the twist pin 108 in the appropriate position to establish good electrical connections during assembly of the three-dimensional module. For example, if the twist pin 108 has been positioned so that the middle bulge 112 has been positioned within the via 124 so that the lower terminal end 130 extends further below the circuit board 104 than is desired, when the lower circuit board 106 is positioned properly relative to the middle circuit board 106, the expanding portion of the lower bulge 114 will contact the edge of the via 126 and the resulting longitudinal force will push the twist pin 108 upward against the frictional contact of the bulge 112 within the via 118. The same situation exists even if the top circuit board 108 is assembled or assembled relative to the middle circuit board 104 before the lower circuit board 106 is positioned. In that case, when the lower bulge 114 contacts the lower via 126, the resulting upward sliding movement of the twist pin 108 will push the expanding portion of the upper bulge 110 into sound electrical contact with the corner edge of the via 122. This self-adjusting or self-aligning characteristic is achieved as a result of the contact of the expanding portion of the non-inserted bulge with the via, and results in simplifying the assembly of the three-dimensional module because exact positioning of the circuit boards is not as critical as in the prior art.

Since the bulges 110 and 114 are not fully inserted into the vias 116 and 120, the module 100 can be readily disassembled. The corner edge contact of the expanding portions of the bulges enables the module 100 to be disassembled and reassembled without having to replace the twist pin 108 or to remove the twist pin 108 from the middle circuit board 104. When the outer circuit boards 102 and 106 are removed from the middle circuit board 104, the compressive and frictional forces between the middle bulge 112 and the via 118 of the middle circuit board 104 retain the twist pin 108 and prevent the twist pin 108 from being moved out of the via 118. Thus, when the module 100 is reassembled with the same or different outer circuit boards 102 and 106, the twist pin 108 is already in position in the middle circuit board 104, thereby eliminating the step of inserting the twist pin 108 into the middle circuit board 104 upon reassembly. The elimination of this step is another improvement over the prior art described above with reference to FIGS. 1–5, wherein the prior art twist pin 50 had to be disposed of upon disassembly of the module 64 and a new twist pin 50 inserted upon reassembly.

Figure 7:
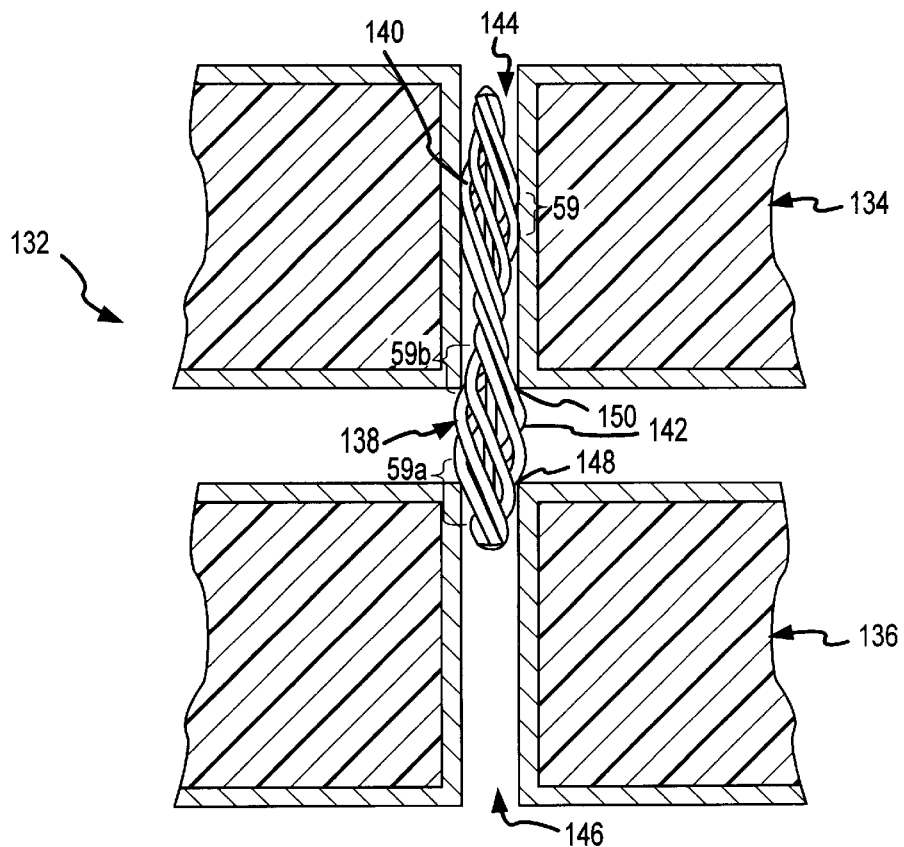
FIG. 7 is a partial, vertical cross-sectional view of a three-dimensional circuit module, formed by multiple printed circuit boards and illustrating a single twist pin electrically connecting the printed circuit boards of the module in accordance with another embodiment of the present invention.

In another three-dimensional circuit module 132 shown in FIG. 7, two circuit boards 134 and 136 are electrically connected by a twist pin 138 having two bulges 140 and 142. The bulge 140 is fully inserted into maximum-width portion 59 of the contact with the side wall of a via 144 of the circuit board 134. The compressive and frictional forces between the bulge 140 and the side wall of the via 144 retains the twist pin 138 relative to the circuit board 134. The other bulge 142 is partially inserted into a via 146 of the other circuit board 136. The expanding portion 57a of the bulge 142 is biased against a corner edge 148 of the via 146 by a longitudinal force transferred through the twist pin 138 from the bulge 140 which frictionally contacts the side wall of the via 144. A radial compressive force between the corner edge 148 and the bulge 142 results because of the angular contact of the lower (as shown) expanding portion 57a of the bulge 142, and this radial compressive force in combination with the longitudinal force from the fully inserted bulge 140 causes a snug fit and a good electrical connection between the edge 148 of the via 146 and the bulge 142.

The compressive and frictional forces that retain the upper bulge 140 within the via 144 may cause the longitudinal and compressive forces that bias the lower (as shown) expanding portion of the bulge 142 against the edge 148 of the via 146, and this force is sufficient itself to establish a good electrical connection between the two circuit boards 134 and 136 through the twist pin 138. However, to enhance that electrical connection, it may be desirable for the upper (as shown) expanding portion 57b of the bulge 142 to also contact a corner edge 150 of the via 144, as shown in FIG. 7. In this circumstance, the lower bulge 142 is partially inserted into both of the vias 144 and 146, but its maximum-width portion is not in contact with the side wall of either via 114 or 116. In this manner, the single bulge 142 is compressed longitudinally between the corner edges 148 and 150 which forces the bulge 142 into radial compressive contact with the edges 148 and 150. An electrical connection is thus established between the single bulge 142 of the twist pin 138 and the vias 144 and 146 by the partial insertion of the single bulge 142 into both vias 144 and 146.

As shown in FIG. 7, the longitudinal and radial compressive forces of the single bulge 142 between the edges 148 and 150 do not restrict the disassembly or separation of the two circuit boards 134 and 136. The circuit board 136 may be removed relative to the circuit board 134 by leaving the twist pin 138 in position. To the extent that the twist pin 138 may move slightly downward (as shown in FIG. 7) upon disassembly, the position of the twist pin 138 will self-adjust once the circuit board 136 is again positioned relative to the circuit board 134. The compressive and frictional contact between the upper bulge 140 and the via 144 retains the twist pin 138 in the upper circuit board 134 when the lower circuit board 136 is separated from the upper circuit board 134.

Figure 8:
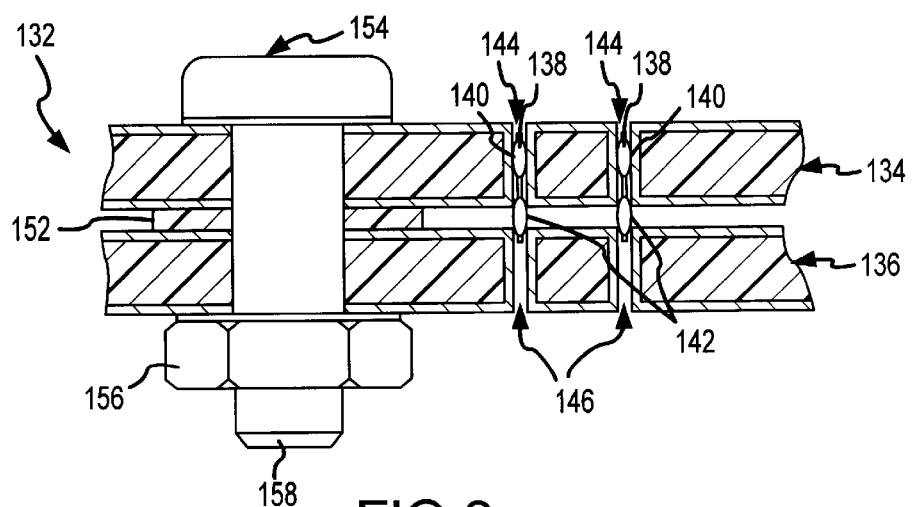
FIG. 8 is a reduced, partial, vertical cross-sectional view of the three-dimensional circuit module shown in FIG. 7, and also showing additional aspects of the module.

Typically, a plurality of the twist pins 138 will electrically connect the circuit boards 134 and 136, as shown in FIG. 8. An insulating spacer 152 separates the circuit boards 134 and 136 at the distance required to ensure proper mechanical interaction and electrical connection between the twist pins 138 and the vias 144 and 146. The insulating spacer 152 may take the form of a number of insulating washers (not shown) positioned at the corners of the substrates and at predetermined locations in the middle of the substrates to support substrates in the spaced apart relationship. The insulating spacer 152 may also take the form of an insulating plate (also not shown) having approximately the same size as the substrates. Holes or cutouts are formed through the insulating plate at the locations of the z-axis electrical interconnections and to accommodate any electrical components that may be attached to the substrates. An appropriate retainer or fastener 154, such as a nut 156 and bolt 158, connect the circuit boards 134 and 136 together to form the module 132 and to maintain the proper electrical and mechanical interaction between the twist pins and the vias. Since the twist pins 138 remain in the upper circuit board 134, reassembly is only a matter of reattaching the circuit boards 134 and 136 with the fastener 154 and spacer 152.

Figure 9:
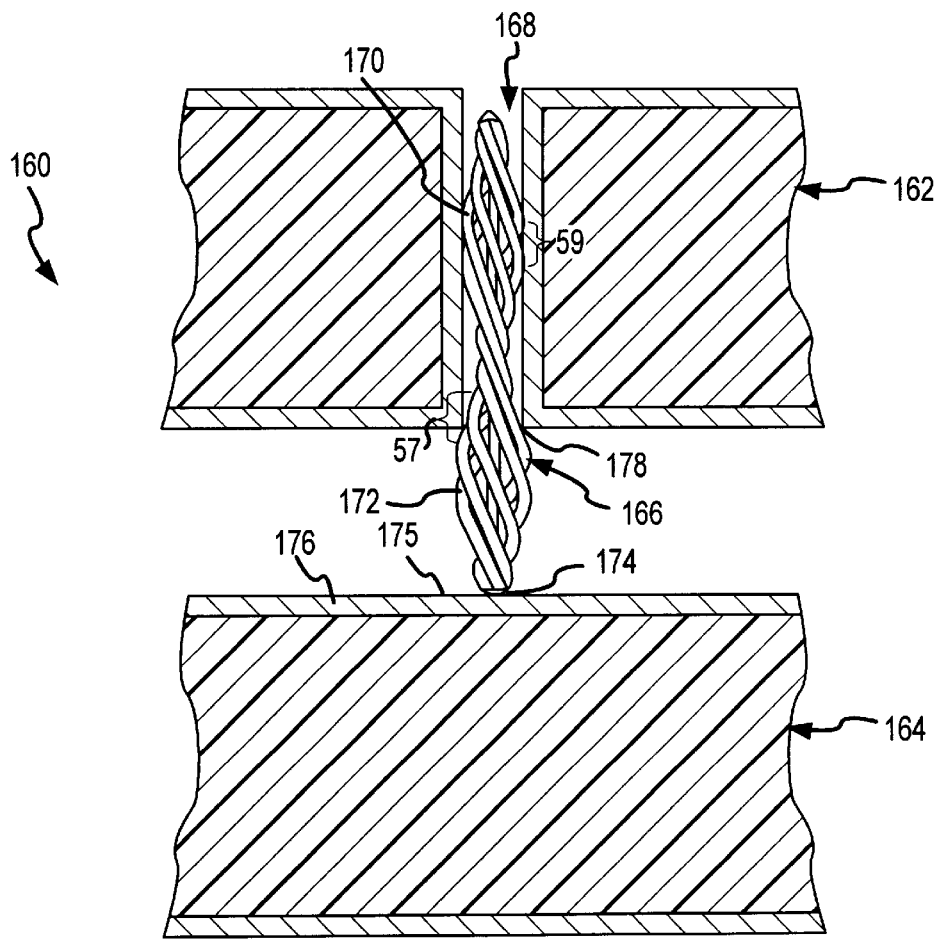
FIG. 9 is a partial, vertical cross-sectional view of a three-dimensional circuit module, formed by multiple printed circuit boards and illustrating a single twist pin electrically connecting the printed circuit boards of the module in accordance with another embodiment of the present invention.

Another three-dimensional circuit module 160, shown in FIG. 9, includes two circuit boards 162 and 164 which are electrically connected by a twist pin 166. The upper circuit board 162 includes a via 168. The twist pin 166 includes two bulges 170 and 172. The maximum-width portion 59 upper bulge 170 of the twist pin 166 is fully inserted into the via 168 and is retained therein by the compressive and frictional forces between the via 168 and the compressed bulge 170. The lower circuit board 164 is connected to the twist pin 166 and the upper circuit 162 at a terminal end 174 of the twist pin 166. The terminal end 174 makes direct contact with a top surface 175 of a metal trace 176 or conductor of the lower circuit board 164. The upper (as shown) expanding portion 57 of the lower bulge 172 contacts a corner edge 178 of the via 168 and the terminal end 174 contacts the metal trace 176. When the two circuit boards 162 and 164 are brought together in the retained relationship as shown in FIG. 9, the expanding portion 57 of the bulge 172 is compressed longitudinally and radially against the edge 178 of the via 168, as a result of the terminal end 174 contacting the metal trace 176. The longitudinal compression resulting from the contact of the expanding portion of the bulge 172 against the edge 178 forces the terminal end 174 into good electrical contact with the metal trace 176 of the lower circuit board 164. An electrical connection between the via 168 and the metal trace 176 is formed, which electrically connects the circuit boards 162 and 164. The electrical connection is maintained by the longitudinal compressive force between the upper (as shown) expanding portion 57 of the bulge 172 contacting the edge 178 and the terminal end 172. The compressive and frictional forces between the upper bulge 170 and the via 168 retain the twist pin 166 in the upper circuit board 162.

Figure 10:
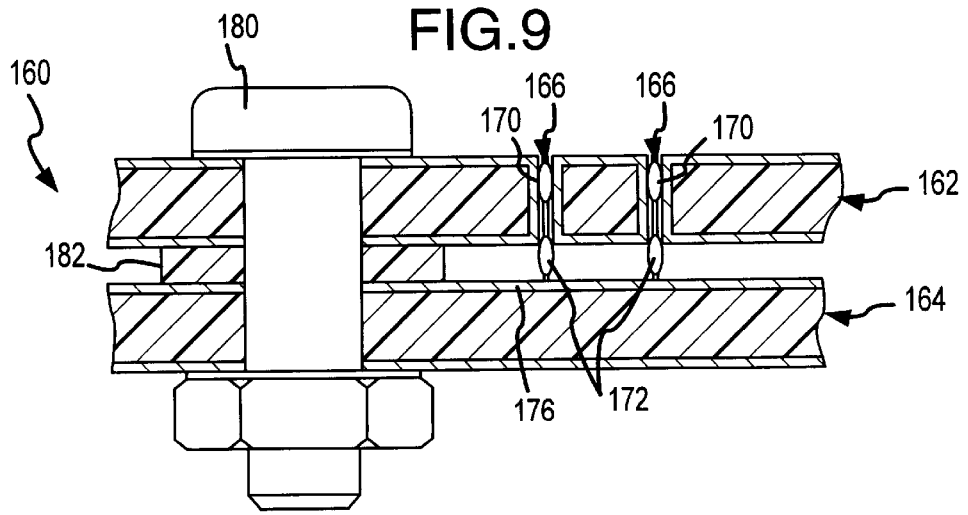
FIG. 10 is a reduced, partial, vertical cross-sectional view of the three-dimensional circuit module shown in FIG. 9, and also showing additional details of the module.

Similar to the circuit module 132 shown in FIG. 8, the circuit boards 162 and 164 of the module 160 shown in FIG. 10 are connected and held relative to one another by a retainer and fastener 180 and an insulating spacer 182 between the circuit boards 162 and 164. Typically, a plurality of the twist pins 166 establish the electrical connections between the circuit boards 162 and 164. The spacer 182 is sized to maintain the circuit boards 162 and 164 at a predetermined vertical spacing so that sufficient longitudinal compressive force is generated by the compressive contact of the upper expanding portion 57 of the bulge 172 with the corner edge 78 of the via 168 to force the lower terminal end of the twist pin into contact with the metal trace 176.

Disassembly of the module 160 involves removal of the fastener 180 and spacer 182 and separation of the circuit boards 162 and 164 without removal of the twist pins 166. Since the twist pins 166 remain in the upper circuit board 162, reassembly is only a matter of reattaching the circuit boards 162 and 164 with the fastener 180 and spacer 182.

Although only two circuit boards 134, 136 and 162, 164 are shown in the modules 132 and 160 (FIGS. 7 and 9), respectively, and only three circuit boards 102–106 (FIG. 6) are shown in the module 100 (FIG. 6), additional circuit boards (not shown) may be included in the modules by replicating the types of electrical connections described above. Disassembly of the module 132 involves removal of the fasteners and spacers, and separation of the circuit boards without removal of the twist pins.

Numerous improvements are attributable to the present invention. Contacting the expanding portions of the bulges of twist pins with the corner edges of the vias, or with a receptacle having a shoulder which will contact the expanding portions of the bulge, induce the radial and longitudinal compression forces used to establish a good electrical connection between the circuit components of the module. The forces to establish the electrical contacts result from the resilient deformation of the expanding portions of the bulges, and those forces are sufficient to accommodate a range of tolerances in positioning between the circuit boards to establish a sound electrical contact. The edges of the vias contact with the expanding portions of the bulges to establish a sound electrical contact. The resilient compressive contact of the bulges which are fully inserted within the vias hold the twist pins relative to at least one of the printed circuit boards to facilitate assembly and disassembly of the three-dimensional circuit module. The inherent self-adjustment of the position of the twist pin to achieve a good electrical connection due to the compressive contact of the expanding portion of the bulge with a corner edge of the via also facilitates sound connections when assembling the module. It is not necessary to waste the material constituting the long leader 68 (FIG. 1) that has to be cut off when using the prior art twist pin connection technique. Disassembly and assembly of the module is permitted without removing or replacing the twist pins, since the twist pins are not damaged, deformed or altered in any way during the original assembly or in the subsequent disassembly or reassembly. Although twist pins have been shown as preferred embodiments of z-axis interconnectors, any type of z-axis interconnector or pin having resilient bulges with expanding portions may suffice for many aspects of the invention.

Presently preferred embodiments of the subject matter herein and its improvements have been described with a degree of particularity. This description has been made by way of preferred example. It should be understood that the scope of the claimed subject matter is defined by the following claims, and should not be unnecessarily limited by the detailed description of the preferred embodiments set forth above.

What is claimed is:

1. A three-dimensional circuit module comprising first and second substrates positioned in a spaced apart relationship with an elongated twist pin extending between and electrically connecting the first and second substrates, the twist pin formed from multiple helically-wound strands and having a bulge located along its length, the bulge having a pair of generally frustroconically-shaped expanding portions expanding laterally outward from an axis of the twist pin to a maximum-width portion, at least one of the first and second substrates including a conductive via having a side wall and a corner edge adjoining the side wall, and an improvement wherein:

one expanding portion of the bulge contacts the corner edge of the via without insertion of the maximum-width portion into compressive contact with the side wall of the via.

2. A circuit module as defined in claim 1 wherein the first and second substrates each include one said via, a first via located on the first substrate, a second via located on the second substrate, the first and second vias located in alignment with one another, and the twist pin includes first and second longitudinally spaced ones of said bulges located along it length, and wherein:

the first bulge is inserted within the first via to contact its maximum-width portion against the side wall of the first via with sufficient radial compression of the bulge to frictionally retain the twist pin relative to the first substrate and to resist longitudinal movement of the twist pin relative to the first substrate; and one expanding portion of the second bulge contacts the corner edge of the second via without insertion of the maximum-width portion of the second bulge into compressive contact with the side wall of the second via.

3. A circuit module as defined in claim 2 wherein:

the compressive contact of the maximum-width portion of the first bulge against the side wall of the first via restrains the twist pin against longitudinal movement relative to the second substrate to maintain the expanding portion of the second bulge in compressive contact with the corner edge of the second via.

4. A circuit module as defined in claim 3 wherein the circuit module further includes a third substrate positioned in a spaced apart relationship from the first and second substrates, the third substrate includes a third said via located in alignment with the first and second vias, and the twist pin includes a third said bulge longitudinally spaced from the first and second bulges, and wherein:

one expanding portion of the third bulge contacts the corner edge of the third via without insertion of the maximum-width portion of the third bulge into compressive contact with the side wall of the third via.

5. A circuit module as defined in claim 4 wherein the first bulge is located between the second and third bulges on the twist pin, the first substrate is positioned between the second and third substrates, and wherein:

the expanding portion of the second bulge on the distal side of the second bulge from the first bulge contacts the corner edge of the second via; and the expanding portion of the third bulge on the distal side of the third bulge from the first bulge contacts the corner edge of the third via.

6. A circuit module as defined in claim 5 wherein:

the contact of the expanding portions of the second and third bulges with the corner edges of the second and third vias Induces compressive contact of the expanding portions of the second and third bulges against the corner edges of the second and third vias, respectively.

7. A circuit module as defined in claim 6 wherein:

the contact of the expanding portions of the second and third bulges with the corner edges of the second and third vias, respectively, and the frictional restraint from contact of the maximum-width portion of the first bulge in compression against the side wall of the first via, collectively restrain the twist pin against movement relative to the substrates to maintain the expanding portions of the second and third bulges in compressive contact with the corner edges of the second and third vias, respectively.

8. A circuit module as defined in claim 1 wherein the twist pin includes first and second longitudinally spaced ones of said bulges located along its length, and one expanding portion of the second bulge is proximally spaced from the first bulge and the other expanding portion of the second bulge is distally spaced from the first bulge, and wherein:

the first bulge is inserted within the via to contact its maximum-width portion against the side wall of the via with sufficient radial compression of the bulge to frictionally retain the twist pin relative to the one substrate and to resist longitudinal movement of the twist pin relative to the one substrate; and the proximal expanding portion of the second bulge contacts the corner edge of the via without insertion of the maximum-width portion of the second bulge into compressive contact with the side wall of the via.

9. A circuit module as defined in claim 8 wherein:

the compressive contact of the maximum-width portion of the first bulge against the side wall of the via restrains the twist pin against longitudinal movement relative to the one substrate to maintain the proximal expanding portion of the second bulge in contact with the corner edge of the via.

10. A circuit module as defined in claim 9 wherein the first and second substrates each include one said via, a first via located on the first substrate, a second via located on the second substrate, the first and second vias located in alignment with one another, and wherein:

the maximum-width portion of the first bulge compressively contacts the side wall of the first via to restrain the twist pin against longitudinal movement relative to the first substrate;

the proximal expanding portion of the second bulge contacts the corner edge of the first via without insertion of the maximum-width portion of the second bulge into compressive contact with the side wall of the first via; and the distal expanding portion of the second bulge contacts the corner edge of the second via without insertion of the maximum-width portion of the second bulge into compressive contact with the side wall of the second via.

11. A circuit module as defined in claim 10 wherein:

the contact of the proximal and distal expanding portions of the second bulge with the corner edges of the first and second vias, respectively, induces radial compression the second bulge against the corner edges of the first and second vias.

12. A circuit module as defined in claim 11 wherein:

the contact of the proximal and distal expanding portions of the second bulge with the corner edges of the first and second vias, respectively, induces longitudinal compression of the second bulge between the corner edges of the first and second vias.

13. A circuit module as defined in claim 8 wherein the twist pin includes a terminal end extending beyond the distal expanding portion of the second bulge, and the second substrate includes a conductor surface formed thereon, and wherein:

the terminal end makes direct end contact with the conductor surface of the second substrate.

14. A circuit module as defined in claim 13 wherein:

the contact of the proximal expanding portion of the second bulge with the corner edge of the first via compresses the expanding portion of the second bulge and induces longitudinal force within the twist pin to maintain the terminal end of the twist pin in contact with the conductor surface of the second element.

15. A circuit module as defined in claim 1 the wherein one expanding portion of the bulge is spaced proximally relative to the first substrate and the other expanding portion of the bulge is spaced distally from the first substrate, the twist pin includes a terminal end extending beyond the distal expanding portion of the bulge, and the second substrate includes a conductor surface formed thereon, and wherein:

the proximal expanding portion of the bulge contacts the corner edge of the via without insertion of the maximum-width portion of the bulge into compressive contact with the side wall of the via; and the terminal end makes direct end contact with the conductor surface of the second substrate.

16. A circuit module as defined in claim 15 wherein:

the contact of the proximal expanding portion of the bulge with the corner edge of the first via compresses the expanding portion of the bulge and induces longitudinal force within the twist pin to maintain the terminal end of the twist pin in end contact with the conductor surface of the second element.

17. A circuit module as defined in claim 1 the wherein one expanding portion of the bulge is spaced proximally relative to the first substrate and the other expanding portion of the second bulge is spaced distally from the first substrate, the first and second substrates each include one said via, a first via is located on the first substrate, a second via located on the second substrate, the first and second vias located in alignment with one another, and wherein:

the proximal expanding portion of the bulge contacts the corner edge of the first via without insertion of the maximuim-width portion of the bulge into compressive contact with the side wall of the first via; and the distal expanding portion of the bulge contacts the corner edge of the second via without insertion of the maximum-width portion of the bulge into compressive contact with the side wall of the second via.

18. A circuit module as defined in claim 17 wherein:

the contact of the proximal and distal expanding portions of the bulge with the corner edges of the first and second vias, respectively, induces radial compression of the bulge against the corner edges of the first and second vias.

19. A circuit module as defined in claim 17 wherein:

the contact of the proximal and distal expanding portions of the bulge with the corner edges of the first and second vias, respectively, induces longitudinal compression of the bulge between the corner edges of the first and second vias.

20. A circuit module as defined in claim 1 further including a third substrate positioned in a spaced apart relationship from the first and second substrates with the second substrate positioned between the first and third substrates, the twist pin extending from the second element toward and electrically connecting the first and third substrates, the first and third substrates each include one said via, one via located on the first substrate in alignment with the twist pin extending from the second substrate, an other via located on the third substrate in alignment with the twist pin extending from the second substrate, and the twist pin includes one said bulge located at a position between the first and second substrates and an other said bulge located at a position between the first and third substrates, and wherein:

one expanding portion of the one bulge contacts the corner edge of the one via without insertion of the maximum-width portion of the one bulge into compressive contact with the side wall of the one via; and one expanding portion of the other bulge contacts the corner edge of the other via without insertion of the maximum-width portion of the other bulge into compressive contact with the side wall of the other via.

21. A circuit module as defined in claim 20 wherein proximal expanding portions of the one and the other bulges are located adjacent to the first substrate and distal expanding portions of the one and the other bulges are located on the opposite sides of the maximum-width portions of the one and the other bulges from the distal expanding portions, and wherein:

the distal expanding portion of the one bulge contacts the corner edge of the one via in the first substrate; and the distal expanding portion of the other bulge contacts the corner edge of the other via in the third substrate.

22. A circuit module as defined in claim 21 wherein:

the contact of the distal expanding portions of the bulges with the corner edges of the one and the other vias induces compressive contact of the distal expanding portions of the bulges against the corner edges of the one and the other vias, respectively.

23. A circuit module as defined in claim 22 wherein:

the contact of the distal expanding portions of the bulges with the corner edges of the one and the other vias restrain the twist pin against movement relative to the substrates and maintain the distal expanding portions of the one and the other bulges in compressive contact with the corner edges of the one and the other vias, respectively.

24. A circuit module as defined in claim 1 wherein the bulge formed by twisting the strands of a longitudinal segment of the twist pin in an anti-helical direction, the one substrate is a printed circuit board, and the via extends through the printed circuit board.

25. A three-dimensional circuit module comprising first and second substrates positioned in a spaced apart relationship with an elongated pin extending from the second substrate and electrically connecting the first and second substrates, the pin having a bulge located along its length, the bulge having a pair of expanding portions extending laterally outward from an axis of the pin to a maximum-width portion, at least one of the first and second substrates including a conducive via having a side wall and a corner edge adjoining the side wall, and an improvement wherein:

one expanding portion of the bulge contacts the corner edge of the via without full insertion of the maximum-width portion into compressive contact with the side wall of the via.

26. A circuit module as defined in claim 25 further including a third substrate positioned in a spaced apart relationship from the second substrate with the second substrate positioned between the first and third substrates, the pin extending from the second element and electrically connecting the third substrate, the first and third substrates each include one said via, one via located on the first substrate in alignment with the pin extending from the second substrate, an other via located on the third substrate in alignment with the pin extending from the second substrate, and the pin includes one said bulge located at a position between the first and second substrates and an other said bulge located at a position between the first and third substrates, and wherein:

one expanding portion of the one bulge contacts the corner edge of the one via without insertion of the maximum-width portion of the one bulge into compressive contact with the side wall of the one via; and one expanding portion of the other bulge contacts of the corner edge of the other via without insertion of the maximum-width portion of the other bulge into compressive contact with the side wall of the other via.

27. A circuit module as defined in claim 25 wherein a proximal expanding portion of the bulge is spaced proximally to the second substrate and the other distal expanding portion of the bulge is spaced distally from the second substrate, the first and second substrates each include one said via, a first via is located on the first substrate, a second via located on the second substrate, the first and second vias located in alignment with one another, and wherein:

the distal expanding portion of the bulge contacts the corner edge of the first via without insertion of the expanding portion of the bulge into compressive contact with the side wall of the first via; and the proximal expanding portion of the bulge contacts the corner edge of the second via without insertion of the expanding portion of the bulge into compressive contact with the side wall of the second via.

28. A circuit module as defined in claim 25 wherein one expanding portion of the bulge is spaced proximally relative to the second substrate and the other expanding portion of the bulge is spaced distally from the second substrate, the pin includes a terminal end extending beyond the distal expanding portion of the bulge, and the first substrate Includes a conductor surface formed thereon, and wherein:

the proximal expanding portion of the bulge contacts the corner edge of the via without insertion of the maximum-width portion of the bulge into compressive contact with the side wall of the via; and the terminal end makes direct end contact with the conductor surface of the first substrate.

29. A method of disassembling the circuit module defined in claim 1, comprising:

separating the expanding portion of the bulge from contact with the corner edge of the via by separating the first substrate from the second substrate; and maintaining electrical contact of the pin with one substrate after separating the expanding portion of the bulge from contact with the via of the other substrate.

30. A method of disassembling the circuit module defined in claim 25, comprising:

separating the expanding portion of the bulge from contact with the corner edge of the via by separating the first substrate from the second substrate; and maintaining electrical contact of the pin with one substrate after separating the expanding portion of the bulge from contact with the via of the other substrate.

31. A method of electrically connecting first and second spaced apart substrates in a three-dimensional circuit module with an elongated pin, comprising:

extending the pin from the second substrate to the first substrate;

selecting the pin to be of a type having a bulge located along its length wherein the bulge has a pair of expanding portions extending laterally outward from an axis of the pin to a maximum-width portion;

selecting at least one of the first and second substrates to have a via wherein the via has a side wall and a corner edge adjoining the side wall;

contacting one expanding portion of the bulge with the corner edge of the via; and maintaining the maximum-width portion out of compressive contact with the side wall of the via.

32. A method as defined in claim 31, further comprising:

including in the circuit module a third element positioned in a spaced apart relationship from and between the first and third substrates;

extending the pin from the second element to the third substrate;

selecting the first element to have a first said via;

selecting the second element to have a second said via;

locating the first via in alignment with the pin extending from the second substrate;

locating the second via in alignment with the pin extending from the second substrate;

selecting the pin to include a first said bulge and a second said bulge longitudinally spaced from one another on the pin;

locating the first bulge on the pin between the first and second substrates;

locating the second bulge on the pin between the second and third substrates;

contacting one expanding portion of the first bulge with the corner edge of the first via;

maintaining the maximum-width portion of the first bulge out of compressive contact with the side wall of the first via;

contacting one expanding portion of the second bulge with the corner edge of the second via;

maintaining the maximum-width portion of the second bulge out of compressive contact with the side wall of the first via.

33. A method as defined in claim 31, further comprising:

spacing a proximal expanding portion of the bulge proximally to the second substrate;

spacing the other distal expanding portion of the bulge distally from the second substrate;

selecting the first element to have a first said via;

selecting the second element to have a second said via;

locating the first and second vias in alignment with one another;

contacting the distal expanding portion of the bulge with the corner edge of the first via;

contacting the proximal expanding portion of the bulge with the corner edge of the second via; and maintaining the maximum-width portion of the bulge out of compressive contact with the side wall of the first and second vias.

34. A method as defined in claim 31, further comprising:

locating one expanding portion of the bulge proximally relative to the second substrate;

locating the other expanding portion of the bulge distally from the second substrate;

selecting the pin to include a terminal end extending beyond the distal expanding portion of the bulge;

selecting the first substrate to include a conductor surface formed thereon; and contacting the proximal expanding portion of the bulge with the corner edge of the via;

maintaining the maximum-width portion of the bulge out of compressive contact with the side wall of the via; and directly contacting the terminal end with the conductor surface of the first substrate.

35. A method as defined in claim 31, further comprising:

selecting the first element to have a first said via;

selecting the second element to have a second said via;

locating the first and second vias in alignment with one another;

selecting the pin to include a first said bulge and a second said bulge longitudinally spaced from one another on the pin;

inserting the first bulge within the first via to contact its maximum-width portion against the side wall of the first via;

compressing the maximum-width portion of the first bulge against the side wall of the first via;

frictionally retaining the pin relative to the first substrate to resist longitudinal movement of the pin relative to the first substrate by compressing the maximum-width portion of the first bulge against the side wall of the first via;

contacting one expanding portion of the second bulge with the corner edge of the second via; and maintaining the maximum-width portion of the second bulge out of compressive contact with the side wall of the second via.

36. A method as defined in claim 35, further comprising:

maintaining the expanding portion of the second bulge in contact with the corner edge of the second via by resisting longitudinal movement of the pin by compressing the maximum-width portion of the first bulge against the side wall of the first via.

37. A method as defined in claim 31, further comprising:

selecting the pin as a twist pin formed from multiple helically-wound strands and in which the bulge is formed by twisting the strands of a longitudinal segment of the twist pin in an anti-helical direction.

38. A method of electrically disconnecting the first and second circuit which have previously been connected as defined in claim 31, comprising:

separating the expanding portion of the bulge from contact with the corner edge of the via by separating the first substrate from the second substrate; and maintaining electrical contact of the pin with one substrate after separating the expanding portion of the bulge from contact with the via of the other substrate.

\* \* \* \* \*